US012095212B2

(12) United States Patent
Steger et al.

(10) Patent No.: US 12,095,212 B2
(45) Date of Patent: Sep. 17, 2024

(54) POWER ELECTRONIC ARRANGEMENT WITH DC VOLTAGE CONNECTION ELEMENT AND METHOD FOR ITS PRODUCTION

(71) Applicant: SEMIKRON ELEKTRONIK GMBH & CO. KG, Nuremberg (DE)

(72) Inventors: Jürgen Steger, Hiltpoltstein (DE); Harald Kobolla, Seukendorf (DE)

(73) Assignee: SEMIKRON ELEKTRONIK GMBH & CO. KG, Nuremberg (DE)

(*) Notice: Subject to any disclaimer, the term of this patent is extended or adjusted under 35 U.S.C. 154(b) by 477 days.

(21) Appl. No.: 17/219,603

(22) Filed: Mar. 31, 2021

(65) Prior Publication Data

US 2021/0336357 A1  Oct. 28, 2021

(30) Foreign Application Priority Data

Apr. 28, 2020  (DE) ..................... 10 2020 111 574.1

(51) Int. Cl.
*H05K 7/00* (2006.01)
*H01L 25/07* (2006.01)
(Continued)

(52) U.S. Cl.
CPC ........... *H01R 4/029* (2013.01); *H01L 25/072* (2013.01); *H01R 4/308* (2013.01);
(Continued)

(58) Field of Classification Search
CPC .... H05K 7/20927; H01R 4/029; H01R 4/308; H01R 43/0221; H01L 25/072
(Continued)

(56) References Cited

U.S. PATENT DOCUMENTS

2022/0301998 A1* 9/2022 Noderer .............. H01L 21/4853
2023/0343688 A1* 10/2023 Barkow ............ H01L 23/49811

FOREIGN PATENT DOCUMENTS

| DE | 102009043181 A1 | 4/2011 |
| DE | D 102017109706 B3 | 3/2018 |
| DE | 102020111574 B3 | 7/2021 |

OTHER PUBLICATIONS

German Serial No. DE 1020111574.1 Translated claims pp. 14-17, 4 pages—German, 4 pages—English.
(Continued)

*Primary Examiner* — Hung S. Bui
(74) *Attorney, Agent, or Firm* — Andrew F. Young; NOLTE LACKENBACH SIEGEL

(57) ABSTRACT

A power electronic arrangement has a power converter module including a switching device with a substrate with a first and a second DC voltage conductor track and a first and a second DC voltage terminal element connected in an electrically conducting manner with the correct polarity, and has a first and a second DC voltage connection element. The first DC voltage terminal element is connected to the first DC voltage connection element in an electrically conducting manner with the correct polarity by means of a first materially-bonded connection. The second DC voltage terminal element is connected to the second DC voltage connection element in an electrically conducting manner with the correct polarity by means of a second materially-bonded connection. The second DC voltage terminal element or the second DC voltage connection element has a continuous welding cavity in the region of the first connection.

14 Claims, 3 Drawing Sheets

(51) Int. Cl.
*H01R 4/02* (2006.01)
*H01R 4/30* (2006.01)
*H01R 43/02* (2006.01)
H02M 3/04 (2006.01)
H05K 7/20 (2006.01)

(52) U.S. Cl.
CPC ........... *H01R 43/0221* (2013.01); *H02M 3/04* (2013.01); *H05K 7/20927* (2013.01)

(58) Field of Classification Search
USPC ........................................................ 361/728
See application file for complete search history.

(56) References Cited

OTHER PUBLICATIONS

German Serial No. DE 1020111574.1 Office Action dated Jan. 26, 2021, 2 pages—German, 2 pages—English.
German Serial No. DE 1020111574.1 Decision to Grant dated Apr. 4, 2021, 3 pages—German, 3 page—English.

* cited by examiner

POWER ELECTRONIC ARRANGEMENT WITH DC VOLTAGE CONNECTION ELEMENT AND METHOD FOR ITS PRODUCTION

CROSS REFERENCE TO RELATED APPLICATIONS

This application relates to and claims priority to DE 10 2020 111 574.1 filed Apr. 28, 2020, the entire contents of which are incorporated herein by reference.

FIGURE SELECTED FOR PUBLICATION

FIG. 1

BACKGROUND OF THE INVENTION

Field of the Invention

The invention relates to a power electronic arrangement and a method for its production. The present power electronic arrangement is designed with a power converter module, comprising a switching device with a substrate with a first and a second DC voltage conductor track and a first and a second DC voltage terminal element connected thereto in an electrically conducting manner with the correct polarity, and having a first and a second DC voltage connection element, wherein each DC voltage terminal element is connected to the associated first DC voltage connection element in an electrically conducting manner with the correct polarity, in each case by means of a materially-bonded connection.

Description of the Related Art

DE 10 2009 043 181 A1 discloses a power converter arrangement having a plurality of power converter assemblies with a cooling device, with power semiconductor modules and with one capacitor device per power converter assembly. In this case the power semiconductor module is arranged adjacent to the capacitor device. The DC load terminal elements of the power semiconductor module are connected by means of a planar busbar to the capacitor device, wherein the planar busbar is formed from a first and second metal shaped body with an insulating intermediate layer and this covers the capacitor device in at least one orientation. The busbars of two adjacent power converter assemblies can be connected to each other in in a low-inductance manner by the first metal shaped bodies being connected using a first connection body and first connection means and by the second metal shaped bodies being connected using a second connection body and second connection means. The first connection body is additionally covered by the second connection body.

DE 10 2017 109 706 B3 discloses a power electronic arrangement designed with a power converter module, with a first and a second DC voltage terminal element and a first and a second DC voltage connection element, which in each case is connected to the associated DC voltage terminal element in an electrically conductive manner with the correct polarity, wherein always the first and the second DC voltage terminal element, as well as the first and second DC voltage connection element, form a stack with an insulation device in each case arranged between them, the first DC voltage terminal element has a first opening enclosed thereby in a first main plane, the second DC voltage connection element has a second opening enclosed thereby and aligned with the first in a third main plane, the second DC voltage terminal element and the first DC voltage connection element are arranged in a second main plane, arranged between the first and third main planes, and are laterally spaced apart from each other in the region of the openings. In the arrangement a clamping device extends in an electrically insulated manner through the first and second openings, thus forming an electrically conducting clamped connection between the first DC voltage terminal element and the first DC voltage connection element, and between the second DC voltage terminal element and the second DC voltage connection element.

ASPECTS AND SUMMARY OF THE INVENTION

Having regard to the prior art referred to, one object of the invention is to present a power electronic arrangement with a power converter module and a method for its production, wherein the connection of DC voltage terminal elements of the power converter module to DC voltage connection elements for the external connection of the power converter module is implemented in a low-inductance manner and in a materially-bonded manner.

This object is achieved according to the invention by a power electronic arrangement having a power converter module, comprising a switching device with a substrate with a first and a second DC voltage conductor track and a first and a second DC voltage terminal element connected thereto in an electrically conducting manner with the correct polarity, and having a first and a second DC voltage connection element, wherein the first DC voltage terminal element is connected to the first DC voltage connection element in an electrically conducting manner with the correct polarity by means of a first materially-bonded connection, wherein the second DC voltage terminal element is connected to the second DC voltage connection element in an electrically conducting manner with the correct polarity by means of a second materially-bonded connection, wherein in the region of each of the connections between the DC voltage terminal element and the associated DC voltage connection element, the first and second DC voltage terminal element, as well as the first and second DC voltage connection element, each form a stack with an insulation device respectively arranged between them when viewed in the normal direction, and wherein the second DC voltage terminal element or the second DC voltage connection element has a continuous welding cavity in the region of the first connection.

The normal direction here is understood to mean the normal direction to the main surfaces of the respective terminal or connection elements in the region of the materially-bonded connections. These terminal and connection elements have respective surface connection sections there, which are also aligned in this normal direction. Here, the term 'oriented in the normal direction' is understood to mean both the positive and the negative normal direction.

Preferably, the respective materially-bonded connection is implemented as a welding joint, in particular as a laser welding joint.

It may be preferable if the first connection is spaced apart from the second connection perpendicular to the normal direction, i.e., laterally, and the connections do not have an overlap region with one another.

It is particularly preferable if the welding cavity is designed as a window or as a one- or two-sided constriction.

It may be preferable if the first DC voltage terminal element or the first DC voltage connection element rests on a support device, which is preferably designed either as part of a housing of the switching device or as part of a cooling device, at least in the region of one of the connections.

It can also be advantageous if the first DC voltage terminal element or the first DC voltage connection element is arranged on the support device in the region of, preferably directly adjacent to, the first connection by means of a clamping device. In this case, the clamping device can be designed as a screw connection with an insulating sleeve at least partially surrounding a screw, and can thus pass in an electrically insulated manner through the opening in the first DC voltage terminal element and preferably also pass through an opening in the second DC voltage connection element.

It is advantageous if the first DC voltage terminal element is arranged in a first main plane, the second DC voltage terminal and the first DC voltage connection element are arranged in a second main plane, and the second DC voltage connection element is arranged in a third main plane, or wherein the first DC voltage connection element is arranged in a first main plane, the second DC voltage connection element and the first DC voltage terminal element are arranged in a second main plane, and the second DC voltage terminal element is arranged in a third main plane and the main planes are stacked in the normal direction.

In principle, it can be advantageous if the insulation devices of the two stacks overlap each other in the region between the first and second connections.

Each respective DC voltage terminal element is preferably designed as a metal foil or metal sheet, with a thickness of preferably 300 µm to 2000 µm, particularly preferably of 500 µm to 1500 µm. It is also preferable if each insulation device is made of a material from the material group of the plastics with high electrical dielectric strength, in particular from polyimide, ethylene tetrafluoroethylene copolymer or liquid crystal polymer, with a thickness of preferably 50 µm to 500 µm, particularly preferably of 75 µm to 150 µm.

It can be advantageous if the DC voltage connection elements form the DC voltage supply of the power converter module and are preferably designed as part of a capacitor device.

The object is additionally achieved by a method for producing an above-mentioned arrangement having the following steps, wherein the steps b) and c) can also be carried out in reverse order or in parallel:

a. arranging the power converter module with a first and a second DC voltage terminal element relative to a capacitor device with a first and second DC voltage connection element, in such a way that a surface connection section of the first DC voltage connection element hereby comes to rest on an associated surface connection section of the first DC voltage terminal element, that a surface connection section of the second DC voltage connection element hereby comes to rest on an associated surface connection section of the second DC voltage terminal element and that a surface connection section of the first DC voltage terminal element or of the first DC voltage connection element, located opposite an associated surface welding section, is accessible for a welding device through a welding cavity of the second DC voltage terminal element or of the second DC voltage connection element;

b. forming a first materially-bonded connection by means of laser welding of the first DC voltage connection element to the first DC voltage terminal element through the welding cavity;

c. forming a second connection by means of laser welding of the second DC voltage connection element to the second DC voltage terminal element.

In doing so it may be preferable for the laser beams in both laser welding processes to act on the respective surface welding sections from the same, preferably a negative, normal direction.

The surface connection sections identify those sections of the terminal and connection elements within which the materially-bonded connection, i.e., the preferred laser welding joint, is formed. The respective surface welding sections identify those sections of the terminal and connection elements on which the laser acts to form the connections.

Of course, provided that this is not excluded inherently or explicitly, the features mentioned in the singular, in particular the power converter module, may also be present in a plurality in the arrangement according to the invention.

It goes without saying that the various embodiments of the invention can be implemented either individually or in any combination, in order to achieve improvements. In particular, the features mentioned and explained above and hereafter can be used not only in the combinations indicated but also in other combinations or by themselves, without departing from the scope of the present invention and regardless of whether they are disclosed in the context of the arrangement or the method.

Further explanations of the invention, advantageous details and features are evident from the following description of the exemplary embodiments of the invention illustrated schematically in FIGS. 1 to 6, or from respective parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
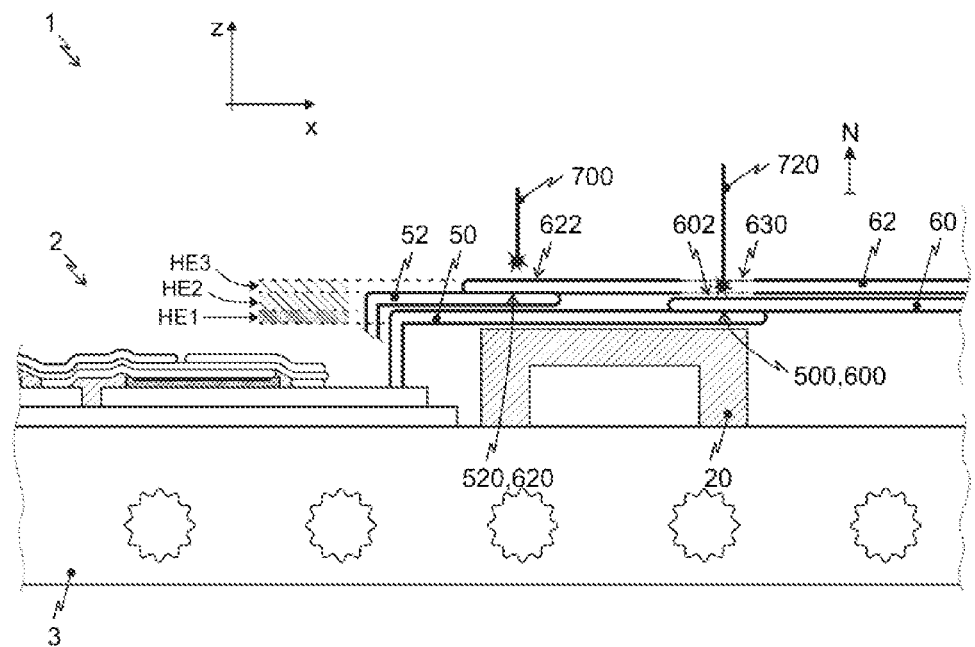
FIG. 1 shows a detail of a first power electronic arrangement, as well as features of the method according to the invention, in a sectional view.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a detail of a first power electronic arrangement in a sectional view, as well as features of the method according to the invention. The figure shows a power converter module 2 having a switching device 4, which is arranged on a metal base plate 3, here designed as a liquid cooling device. To provide electrical insulation from the liquid cooling device 3 and thermal coupling to the liquid cooling device 3, this switching device 4 has an insulating material body 40, implemented as a ceramic body. On the side facing away from the liquid cooling device 3 this ceramic body 40 has a plurality of conductor tracks 42, which in the operation of the switching device 4 have different potentials. One of these conductor tracks 42, a first DC voltage conductor track, has a first DC voltage potential, while a further, a second DC voltage conductor track, has a second DC voltage potential. As an example, the switching device 4 forms a power converter circuit.

On at least one of these conductor tracks 42, which together with the insulating material body 40 form the substrate of the switching device 4, power semiconductor devices 44 are arranged in a standard manner and connected to form a circuit. The connection in this embodiment is implemented as a standard film composite 46 made from electrically conductive and electrically insulating films stacked alternately.

For external connection, the power converter module 2 has two DC voltage terminal elements 50, 52, which are each connected in an electrically conducting manner to a DC voltage conductor track 42 carrying the DC voltage potential. This connection is implemented in a standard way, in this case without restriction of generality, as a pressure sintering connection. These DC voltage terminal elements 50, 52 are used to make the connection to associated DC voltage connection elements 60, 62, which are preferably connected to a capacitor device.

In this embodiment, the first DC voltage terminal element 50 rests on a support surface 240 of the housing 20. The second DC voltage terminal element 52 ends recessed with respect to the first DC voltage connection element 50, with the result that its surface connection section 500 is accessible from above, i.e., in the negative normal direction, i.e., also the negative z-direction. The surface connection section 600 of the first DC voltage connection element 60 rests on the associated surface connection section 500 of the first DC voltage terminal element 50 after the method step a). Likewise, the surface connection section 620 of the second DC voltage connection element 62 rests on the associated surface connection section 520 of the second DC voltage terminal element 52. The first DC voltage connection element 60 ends recessed relative to the second DC voltage connection element 62. Thus, the respective contact surfaces are spaced apart from each other laterally, i.e., perpendicular to the normal direction N of the respective surface connection section.

In the area of the surface connection section 500 of the first DC voltage terminal element 50, its course is defined by a first main plane HE1. The region of the surface connection section 520 of the second DC voltage terminal element 52 and of the surface connection section 600 of the first DC voltage connection element 60 defines a second main plane HE2, directly following the first, in the normal direction N, in this case the positive z-direction. The region of the surface connection section 620 of the second DC voltage connection element 62 defines a third main plane HE3, directly following the second in the normal direction N.

The surface welding section 622 opposite the surface connection section of the second DC voltage connection element 62, thus arranged on the opposite main surface, is accessible for a laser beam of a welding laser from the negative normal direction N. The action of a first laser beam 700 of a welding laser on the surface welding section 622 of the second DC voltage connection element 62 forms a first connection, thus here a first welding joint, that between the second DC voltage terminal element 52 and the second DC voltage connection element 62.

Figure 4:
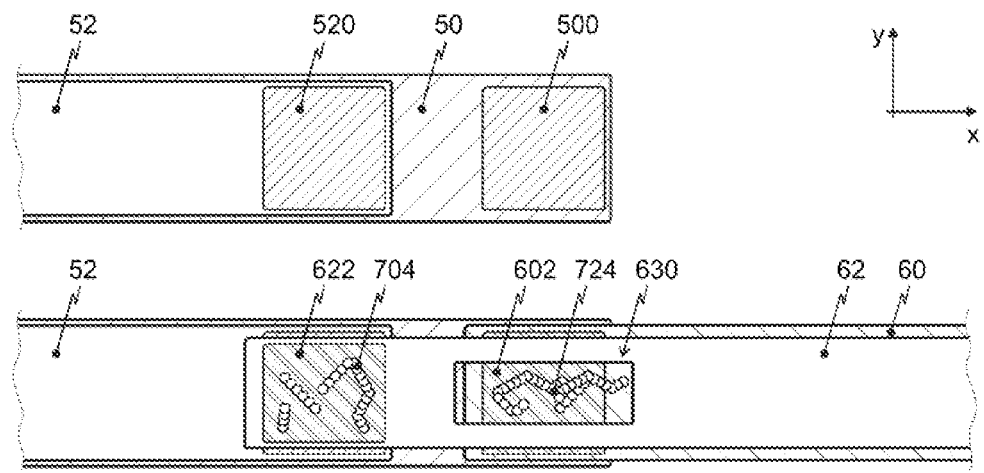
FIG. 4 shows essential steps of the method according to the invention.

The second DC voltage connection element 62 has a welding cavity 630 in the normal direction N, here the z-direction, aligned with the surface connection sections 500, 600 of the first DC voltage terminal element 50 and of the first DC voltage connection element 60, cf. also FIG. 4. This welding cavity 630 forms a window through which the surface welding section 602 of the first DC voltage connection element 60 is accessible for a laser beam. The action of a second laser beam 720 of a welding laser on the surface welding section 602 of the first DC voltage connection element 60 forms a second connection, thus here a second welding joint, that between the first DC voltage terminal element 50 and the first DC voltage connection element 60.

Figure 2:
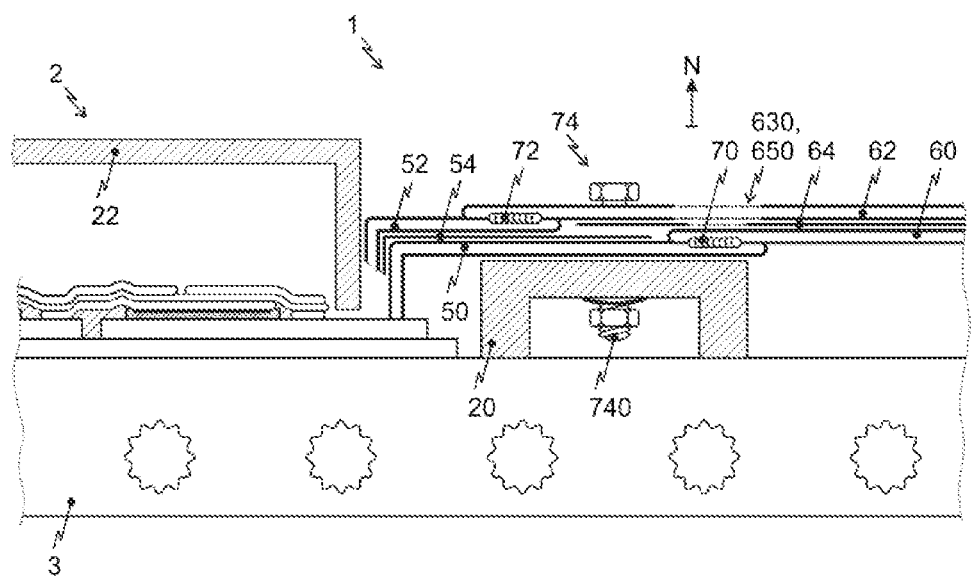
FIG. 2 shows a detail of a second power electronic arrangement in a sectional view.

In the area of the connection between DC voltage terminal elements 50, 52 and DC voltage connection elements 60, 62, the first DC voltage terminal element 50 and the second DC voltage terminal element 52 therefore form a stack, wherein an insulation device 54 is arranged between the two DC voltage terminal elements 50, 52, and shown in exemplary form in FIG. 2. The first DC voltage terminal element 50 rests on the supporting surface 240 of the housing 20, only partially shown, of the power converter module 2. This housing 20 is only implemented as a partial housing 22 in this embodiment, and thus does not completely enclose the switching device 4, as would be possible.

The housing 20 of the power converter module 2 itself is formed from a high-temperature-resistant plastic, here a polyphenylene sulphide, which also has a high flexural strength. The DC voltage terminal elements 50, 52, as well as the DC voltage connection elements 60, 62, are implemented as thin metal sheets, here more precisely copper sheets, with a thickness of 700 μm. Each insulation device 54, 64, both between the DC voltage terminal elements 50, 52 and between the DC voltage connection elements 60, 62, is made from a plastic with high electrical dielectric strength, here from ethylene tetrafluoroethylene copolymer or liquid crystal polymer, with a thickness of 100 μm.

FIG. 2 shows a detail of a second power electronic arrangement in a sectional view. This differs from the first design in that a clamping device 74, which has been implemented as a screw connection 4, is also present here.

Here, the first DC voltage terminal element 50 has an opening 500, and the second DC voltage terminal element 52 ends recessed relative to this first opening. Similarly, the second DC voltage connection element 62 has an opening, and the first DC voltage connection element 60 ends recessed relative to this opening. Furthermore, the housing 20 also has an opening which is aligned with these openings.

All the openings are therefore arranged in alignment with one another, wherein the screw of the screw connection 740 passes through all the openings and the terminal and connection elements are fixed on the housing 20. Alternatively, but not shown, the screw of the screw connection can also engage in a further opening of the cooling device 3 fitted with an internal thread, and thus additionally fix the power converter module thereto.

Also illustrated are the first and second connections 70, 72, which were formed in the same way as described for FIG. 1. Also shown is the welding cavity 650 of the insulation device 64 between the first and second DC voltage connection elements 60, 62. This welding cavity 650 is preferably smaller than that of the second DC voltage connection element 62 and aligned with it in the normal direction N.

Figure 3:
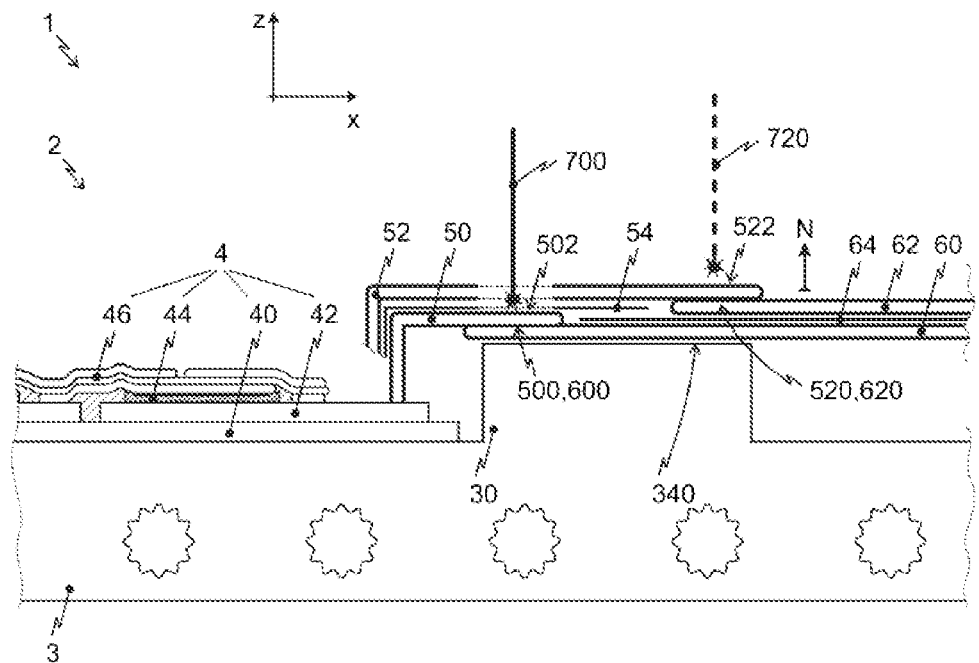
FIG. 3 shows a detail of a third power electronic arrangement, as well as features of the method according to the invention, in a sectional view.

FIG. 3 shows a detail of a third power electronic arrangement 1 in a sectional view, as well as features of the method according to the invention. In contrast to the first embodiment according to FIGS. 1 and 2, the first DC voltage connection element 60 in this case rests on the cooling device 3 in an electrically insulated manner, in fact directly and therefore with excellent thermal conductance. For this purpose, and purely as an example, the cooling device has an elevation 30 with a supporting surface 340.

After method step a) the first DC voltage terminal element 50 rests with its surface connection section 500 on the surface connection section 600 of the first DC voltage connection element 60. Likewise, the second DC voltage terminal element 52 rests with its surface connection section 520 on the surface connection section 620 of the second DC voltage connection element 62.

The second DC voltage terminal element 52 as well as the insulation device 54 arranged between this and the first DC voltage terminal element 50 each have a welding cavity 530, 550 aligned flush with each other. In this case, the welding cavity 530 of the second DC voltage terminal element 52 again has a larger diameter than the welding cavities 550 of the insulation device 54.

The action of a first laser beam 700 of a welding laser on the surface welding section 502, which is located opposite the surface connection section 500 of the first DC voltage terminal element 50 and accessible through the welding cavities 530, 550, is used to form a first welding joint.

Likewise, the action of a second laser beam 720 of a welding laser on the surface welding section 622 opposite the surface connection section 620 of the second DC voltage connection element 62 forms a second welding joint between the second DC voltage terminal element 52 and the second DC voltage connection element 62.

FIG. 4 shows the essential steps of the method according to the invention in plan view from the normal direction N, i.e., from the z-direction, onto the terminal and connection elements.

The top part of the figure shows a first DC voltage terminal element 50 with its surface connection section 500, and a second DC voltage terminal element 52 with its surface connection section 520.

Below it a first DC voltage connection element 60 is additionally shown, which rests with its surface connection section on the surface connection section 500 of the first DC voltage terminal element 50. The first voltage connection element 60 has a surface welding section 602 located opposite the surface connection section. Both sections are thus located on opposite main surfaces of the DC voltage connection element 60.

Also shown is a second DC voltage connection element 62, which rests with its surface connection section on the surface connection section 520 of the second DC voltage terminal element 52. The second voltage connection element 62 comprises a surface welding section 622 located opposite the surface connection section. Both sections are thus located on opposite main surfaces of the DC voltage connection element 62.

This second DC voltage connection element 62 also has a window-like welding cavity 630, which is formed in alignment, but as shown here not necessarily coincident, with the surface connection section 600 of the first DC voltage connection element 60. By means of this welding cavity 630 the surface welding section 602 of the first DC voltage connection element 60 is accessible to a laser beam from the normal direction.

Also shown is the laser track 704, which is created by laser welding when forming the second connection on the surface welding section 622 of the second DC voltage connection element 62. The laser track 724 which is created by laser welding through the welding cavity 630 on the surface welding section 602 of the first DC voltage connection element 60 is also shown.

Figure 5:
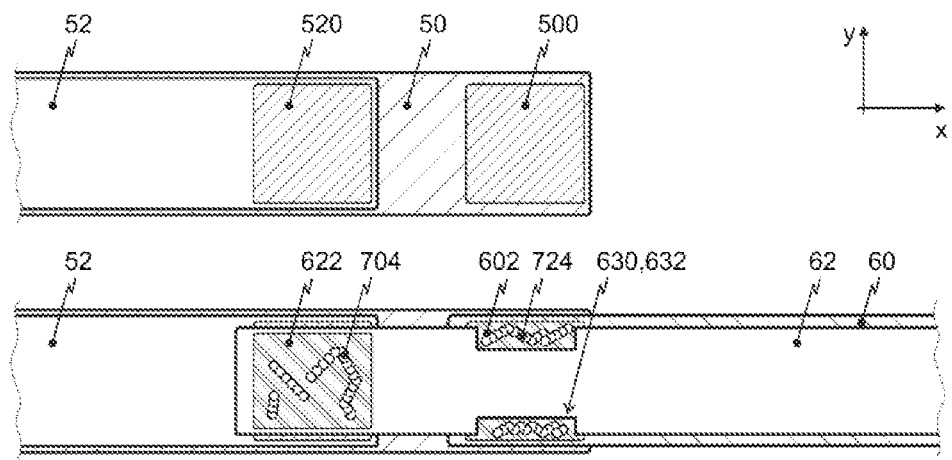
FIG. 5 shows essential steps of a variant of the method according to the invention.

FIG. 5 shows essential steps of a variant of the method according to the invention. In this variant, the welding cavity 630 is designed as a double-sided, here asymmetrical, constriction 632.

Figure 6:
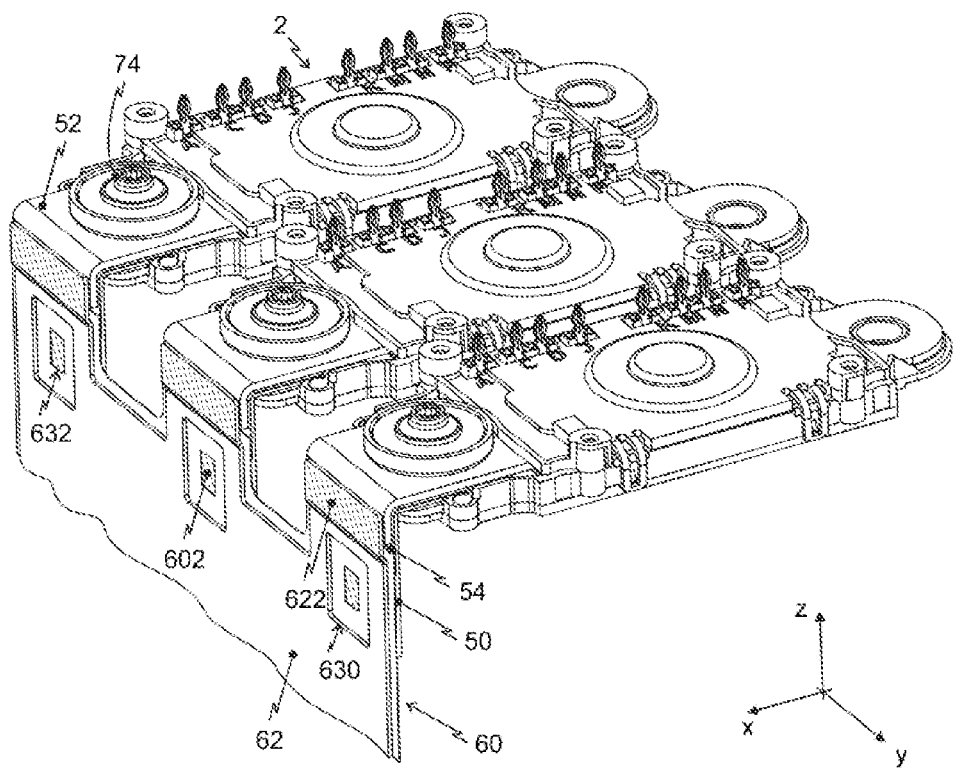
FIG. 6 shows a three-dimensional view of a power electronic arrangement according to the invention.

FIG. 6 shows a three-dimensional view of a power electronic arrangement according to the invention. All of the essential elements shown are already described above, however all terminal and connection elements have an angled section, which is used to align the normal vector and hence all layers related to it in the x-direction.

It is to be noted that of course features of different exemplary embodiments of the invention can be combined with one another in an arbitrary manner, unless the features are mutually exclusive, without departing from the scope of the invention.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic arrangement, comprising:
 a power converter module, further comprising:
  a switching device with a substrate with a first and a second DC voltage conductor track and a first and a second DC voltage terminal element connected thereto in an electrically conducting manner with a respective correct polarity;
  a first and a second DC voltage connection element wherein the first DC voltage terminal element is connected to the first DC voltage connection element in an electrically conducting manner with said correct polarity by means of a first materially-bonded connection;

wherein the second DC voltage terminal element is connected to the second DC voltage connection element in an electrically conducting manner with the respective correct polarity by means of a respective second materially-bonded connection;

wherein proximate each of the respective first and second materially-bonded connections and between the DC voltage terminal element and the associated DC voltage connection element, the first and second DC voltage terminal elements, and respective said first and second DC voltage connection elements, is formed a respective first stack and a second stack each with a respective first and a respective second insulation device arranged in between them viewed in a normal direction (N); and wherein the second DC voltage terminal element or the second DC voltage connection element has a continuous welding cavity in the region of the first connection.

2. The power electronic arrangement, according to claim 1, wherein:

each respective first and second materially-bonded connection is implemented as a welding joint.

3. The power electronic arrangement, according to claim 2, wherein:

the welding cavity is designed as one of a window and a one- or two-sided constriction.

4. The power electronic arrangement, according to claim 3, wherein:

the first DC voltage terminal element or the first DC voltage connection element rests on a supporting device; and said supporting device is at least one of a part of a housing of the switching device, and a part of a cooling device located proximate one of said first and said second materially-bonded connections.

5. The power electronic arrangement, according to claim 4, wherein;

the first DC voltage terminal element or the first DC voltage connection element is arranged on the support device directly adjacent to the first material-bonded connection by means of a clamping device.

6. The power electronic arrangement, according to claim 5, wherein:

the clamping device is a threated connection and with an insulating sleeve at least partially surrounding a screw, and passes in an electrically insulated manner through at least one of a first opening of the first DC voltage terminal element and said first opening and a second opening of the second DC voltage connection element.

7. The power electronic arrangement, according to claim 6, wherein:

the first DC voltage terminal element is arranged in a first main plane;

the second DC voltage terminal element and the first DC voltage connection element are arranged in a second main plane;

the second DC voltage connection element is arranged in a third main plane; and the first main plain, the second main plane and the third main plane are stacked in the normal direction (N).

8. The power electronic arrangement, according to claim 7, wherein:

the insulation devices of the respective first and the second stacks overlap each other between the first and the second materially-bonded connections.

9. The power electronic arrangement, according claim 8, wherein:

each DC voltage terminal element is a metal foil sheet with a thickness of 300 μm to 2000 μm.

10. The power electronic arrangement, according to claim 9, wherein:

each respective said first and said second insulation device is formed of a plastic material from a group of high electrical dielectric strength plastic materials including a polyimide, an ethylene tetrafluoroethylene copolymer, and a liquid crystal polymer; and said plastic material has a thickness of 50 μm to 500 μm.

11. The power electronic arrangement, according to claim 10, wherein:

the first and the second DC voltage connection elements form the DC voltage supply of the power converter module and are part of a capacitor device.

12. A method for producing a power electronic arrangement according to claim 11, comprising the following steps, wherein the steps b) and c) can be carried out in one of direct order, reverse order and parallel order:

a. arranging the power converter module with said first and said second DC voltage terminal element relative to said capacitor device with said first and said second DC voltage connection element, in such a way that a surface connection section of the first DC voltage connection element comes to rest on an associated surface connection section of the first DC voltage terminal element, that a surface connection section of the second DC voltage connection element hereby comes to rest on an associated surface connection section of the second DC voltage terminal element and that a surface connection section of the first DC voltage terminal element or the first DC voltage connection element is located opposite an associated surface welding section, and is accessible for an external welding device through said welding cavity of the second DC voltage terminal element or of the second DC voltage connection element;

b. forming said first materially-bonded connection by means of a step of laser welding of the first DC voltage connection element to the first DC voltage terminal element through the welding cavity; and c. forming said second materially-bonded connection by means a step of laser welding of the second DC voltage connection element to the second DC voltage terminal element.

13. The method for producing a power electronic arrangement, according to claim 12, wherein:

in each respective said laser welding steps respective laser beams act on respective surface welding sections from the same direction and from the negative normal direction (N).

14. The power electronic arrangement, according to claim 6, wherein:

the first DC voltage connection element is arranged in a first main plane;

the second DC voltage connection element and the first DC voltage terminal element are arranged in a second main plane;

the second DC voltage terminal element is arranged in a third main plane; and the first main plain, the second main plane and the third main plane are stacked in the normal direction (N).

\* \* \* \* \*